US008821637B2

(12) United States Patent
Gelatos et al.

(10) Patent No.: US 8,821,637 B2
(45) Date of Patent: Sep. 2, 2014

(54) TEMPERATURE CONTROLLED LID ASSEMBLY FOR TUNGSTEN NITRIDE DEPOSITION

(75) Inventors: Avgerinos V. Gelatos, Redwood City, CA (US); Sang-Hyeob Lee, Fremont, CA (US); Xiaoxiong Yuan, San Jose, CA (US); Salvador P. Umotoy, Antioch, CA (US); Yu Chang, San Jose, CA (US); Gwo-Chuan Tzu, Sunnyvale, CA (US); Emily Renuart, Santa Clara, CA (US); Jing Lin, Mountain View, CA (US); Wing-Cheong Lai, Santa Clara, CA (US); Sang Q. Le, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1382 days.

(21) Appl. No.: 12/021,825

(22) Filed: Jan. 29, 2008

(65) Prior Publication Data

US 2008/0202425 A1 Aug. 28, 2008

Related U.S. Application Data

(60) Provisional application No. 60/887,142, filed on Jan. 29, 2007, provisional application No. 60/944,085, filed on Jun. 14, 2007.

(51) Int. Cl.
*C23C 16/455* (2006.01)
*C23C 16/00* (2006.01)

(52) U.S. Cl.
USPC ............. 118/715; 118/724; 156/345.34

(58) Field of Classification Search
USPC ........... 118/715, 724; 156/345.33, 345.34, 156/345.37
See application file for complete search history.

(56) References Cited

U.S. PATENT DOCUMENTS

| 4,058,430 A | 11/1977 | Suntola et al. |
| 4,389,973 A | 6/1983 | Suntola et al. |
| 4,413,022 A | 11/1983 | Suntola et al. |
| 4,415,275 A | 11/1983 | Dietrich |
| 4,761,269 A | 8/1988 | Conger et al. |
| 4,825,809 A | 5/1989 | Mieno et al. |
| 4,834,831 A | 5/1989 | Nishizawa et al. |
| 4,947,790 A | 8/1990 | Gartner et al. |

(Continued)

FOREIGN PATENT DOCUMENTS

| EP | 0497267 | 8/1992 |
| EP | 1167569 | 1/2002 |

(Continued)

*Primary Examiner* — Jeffrie R Lund
(74) *Attorney, Agent, or Firm* — Patterson & Sheridan, LLP

(57) ABSTRACT

Embodiments of the invention provide apparatuses for vapor depositing tungsten-containing materials, such as metallic tungsten and tungsten nitride. In one embodiment, a processing chamber is provided which includes a lid assembly containing a lid plate, a showerhead, a mixing cavity, a distribution cavity, and a resistive heating element contained within the lid plate. In one example, the resistive heating element is configured to provide the lid plate at a temperature within a range from about 120° C. to about 180° C., preferably, from about 140° C. to about 160° C., more preferably, from about 145° C. to about 155° C. The mixing cavity may be in fluid communication with a tungsten precursor source containing tungsten hexafluoride and a nitrogen precursor source containing ammonia. In some embodiments, a single processing chamber may be used to deposit metallic tungsten and tungsten nitride materials by CVD processes.

14 Claims, 13 Drawing Sheets

(56) References Cited

U.S. PATENT DOCUMENTS

| | | |
|---|---|---|
| 4,975,252 A | 12/1990 | Nishizawa et al. |
| 4,993,357 A | 2/1991 | Scholz et al. |
| 5,027,746 A | 7/1991 | Frijlink et al. |
| 5,173,327 A | 12/1992 | Sandhu et al. |
| 5,178,681 A | 1/1993 | Moore et al. |
| 5,224,202 A | 6/1993 | Arnold et al. |
| 5,225,366 A | 7/1993 | Yoder |
| 5,261,959 A | 11/1993 | Gasworth |
| 5,281,274 A | 1/1994 | Yoder |
| 5,294,286 A | 3/1994 | Nishizawa et al. |
| 5,338,362 A | 8/1994 | Imahashi et al. |
| 5,374,570 A | 12/1994 | Nasu et al. |
| 5,441,703 A | 8/1995 | Jurgensen et al. |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,558,717 A | 9/1996 | Zhao et al. |
| 5,580,421 A | 12/1996 | Hiatt et al. |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,835,677 A | 11/1998 | Li et al. |
| 5,846,332 A | 12/1998 | Zhao et al. |
| 5,855,680 A | 1/1999 | Soininen et al. |
| 5,879,459 A | 3/1999 | Gadgil et al. |
| 5,882,411 A | 3/1999 | Zhao et al. |
| 5,906,683 A | 5/1999 | Chen et al. |
| 5,916,365 A | 6/1999 | Sherman |
| 5,972,430 A | 10/1999 | DiMeo, Jr. et al. |
| 5,989,345 A | 11/1999 | Hatano et al. |
| 6,001,267 A | 12/1999 | Os et al. |
| 6,015,590 A | 1/2000 | Suntola et al. |
| 6,042,652 A | 3/2000 | Hyun et al. |
| 6,071,572 A | 6/2000 | Mosely et al. |
| 6,079,356 A | 6/2000 | Umotoy et al. |
| 6,099,904 A | 8/2000 | Mak et al. |
| 6,139,700 A | 10/2000 | Kang et al. |
| 6,143,082 A | 11/2000 | McInerney et al. |
| 6,156,382 A | 12/2000 | Rajagopalan et al. |
| 6,162,715 A | 12/2000 | Mak et al. |
| 6,174,377 B1 | 1/2001 | Doering et al. |
| 6,183,563 B1 | 2/2001 | Choi et al. |
| 6,197,683 B1 | 3/2001 | Kang et al. |
| 6,200,893 B1 | 3/2001 | Sneh |
| 6,206,967 B1 | 3/2001 | Mak et al. |
| 6,231,672 B1 | 5/2001 | Choi et al. |
| 6,251,190 B1 | 6/2001 | Mak et al. |
| 6,270,572 B1 | 8/2001 | Kim et al. |
| 6,270,839 B1 | 8/2001 | Onoe et al. |
| 6,296,711 B1 | 10/2001 | Loan et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,309,713 B1 | 10/2001 | Mak et al. |
| 6,309,966 B1 * | 10/2001 | Govindarajan et al. ....... 438/656 |
| 6,433,314 B1 | 8/2002 | Mandrekar et al. |
| 6,447,607 B2 | 9/2002 | Soininen et al. |
| 6,452,338 B1 | 9/2002 | Horsky |
| 6,454,860 B2 | 9/2002 | Metzner et al. |
| 6,478,872 B1 | 11/2002 | Chae et al. |
| 6,481,945 B1 | 11/2002 | Hasper et al. |
| 6,511,539 B1 | 1/2003 | Raaijmakers et al. |
| 6,579,372 B2 | 6/2003 | Park |
| 6,593,484 B2 | 7/2003 | Yasuhara et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,720,027 B2 | 4/2004 | Yang et al. |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,797,108 B2 | 9/2004 | Wendling |
| 6,815,285 B2 | 11/2004 | Choi et al. |
| 6,818,094 B2 | 11/2004 | Yudovsky |
| 6,821,563 B2 | 11/2004 | Yudovsky |
| 6,827,815 B2 | 12/2004 | Hytros et al. |
| 6,841,200 B2 | 1/2005 | Kraus et al. |
| 6,861,356 B2 | 3/2005 | Matsuse et al. |
| 6,866,746 B2 | 3/2005 | Lei et al. |
| 6,868,859 B2 | 3/2005 | Yudovsky |
| 6,878,206 B2 | 4/2005 | Tzu et al. |
| 6,881,437 B2 | 4/2005 | Ivanov et al. |
| 6,902,624 B2 | 6/2005 | Seidel et al. |
| 6,905,541 B2 | 6/2005 | Chen et al. |
| 6,905,737 B2 | 6/2005 | Verplancken et al. |
| 6,911,093 B2 | 6/2005 | Stacey et al. |
| 6,915,592 B2 | 7/2005 | Guenther |
| 6,916,398 B2 | 7/2005 | Chen et al. |
| 6,921,062 B2 | 7/2005 | Gregg et al. |
| 6,932,871 B2 | 8/2005 | Chang et al. |
| 6,936,906 B2 | 8/2005 | Chung et al. |
| 6,946,033 B2 | 9/2005 | Tsuei et al. |
| 6,955,211 B2 | 10/2005 | Ku et al. |
| 6,983,892 B2 | 1/2006 | Noorbakhsh et al. |
| 6,994,319 B2 | 2/2006 | Yudovsky |
| 6,998,014 B2 | 2/2006 | Chen et al. |
| 7,066,194 B2 | 6/2006 | Ku et al. |
| 7,085,616 B2 | 8/2006 | Chin et al. |
| 7,175,713 B2 | 2/2007 | Thakur et al. |
| 7,186,385 B2 | 3/2007 | Ganguli et al. |
| 7,201,803 B2 | 4/2007 | Lu et al. |
| 7,204,886 B2 * | 4/2007 | Chen et al. .................... 118/715 |
| 7,222,636 B2 | 5/2007 | Nguyen et al. |
| 7,228,873 B2 | 6/2007 | Ku et al. |
| 7,270,709 B2 | 9/2007 | Chen et al. |
| 7,294,208 B2 | 11/2007 | Guenther |
| 7,408,225 B2 | 8/2008 | Shinriki et al. |
| 2001/0000866 A1 | 5/2001 | Sneh et al. |
| 2001/0009140 A1 | 7/2001 | Bondestam et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0042523 A1 | 11/2001 | Kesala |
| 2001/0042799 A1 | 11/2001 | Kim et al. |
| 2001/0054377 A1 | 12/2001 | Lindfors et al. |
| 2002/0000196 A1 | 1/2002 | Park |
| 2002/0005168 A1 | 1/2002 | Kraus et al. |
| 2002/0007790 A1 | 1/2002 | Park |
| 2002/0009544 A1 | 1/2002 | McFeely et al. |
| 2002/0009896 A1 | 1/2002 | Sandhu et al. |
| 2002/0017242 A1 | 2/2002 | Hamaguchi et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors |
| 2002/0110991 A1 | 8/2002 | Li |
| 2002/0115886 A1 | 8/2002 | Yasuhara et al. |
| 2002/0121241 A1 | 9/2002 | Nguyen et al. |
| 2002/0121342 A1 | 9/2002 | Nguyen et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0145210 A1 | 10/2002 | Tompkins et al. |
| 2002/0146511 A1 | 10/2002 | Chiang et al. |
| 2002/0197856 A1 | 12/2002 | Matsuse et al. |
| 2003/0004723 A1 | 1/2003 | Chihara |
| 2003/0010451 A1 | 1/2003 | Tzu et al. |
| 2003/0017697 A1 | 1/2003 | Choi et al. |

(56) References Cited

U.S. PATENT DOCUMENTS

| | | |
|---|---|---|
| 2003/0023338 A1 | 1/2003 | Chin et al. |
| 2003/0042630 A1 | 3/2003 | Babcoke et al. |
| 2003/0053799 A1 | 3/2003 | Lei |
| 2003/0057527 A1 | 3/2003 | Chung et al. |
| 2003/0072913 A1 | 4/2003 | Chou et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0101927 A1 | 6/2003 | Raaijmakers |
| 2003/0101938 A1 | 6/2003 | Ronsse et al. |
| 2003/0106490 A1 | 6/2003 | Jallepally et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0167612 A1 | 9/2003 | Kraus et al. |
| 2003/0172872 A1 | 9/2003 | Thakur et al. |
| 2003/0194493 A1 | 10/2003 | Chang et al. |
| 2003/0198740 A1 | 10/2003 | Wendling |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0235961 A1 | 12/2003 | Metzner et al. |
| 2004/0005749 A1 | 1/2004 | Choi et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0025370 A1 | 2/2004 | Guenther |
| 2004/0065255 A1 | 4/2004 | Yang et al. |
| 2004/0067641 A1 | 4/2004 | Yudovsky |
| 2004/0069227 A1 | 4/2004 | Ku et al. |
| 2004/0071897 A1 | 4/2004 | Verplancken et al. |
| 2004/0143370 A1 | 7/2004 | Lu et al. |
| 2004/0144308 A1 | 7/2004 | Yudovsky |
| 2004/0144309 A1 | 7/2004 | Yudovsky |
| 2004/0144311 A1* | 7/2004 | Chen et al. ............ 118/715 |
| 2004/0144431 A1 | 7/2004 | Yudovsky |
| 2004/0170403 A1 | 9/2004 | Lei |
| 2004/0203254 A1 | 10/2004 | Conley et al. |
| 2004/0211665 A1 | 10/2004 | Yoon et al. |
| 2004/0219784 A1 | 11/2004 | Kang et al. |
| 2004/0224506 A1 | 11/2004 | Choi et al. |
| 2004/0231799 A1* | 11/2004 | Lee et al. ............ 156/345.34 |
| 2004/0235285 A1 | 11/2004 | Kang et al. |
| 2004/0253375 A1 | 12/2004 | Ivanov et al. |
| 2005/0006799 A1 | 1/2005 | Gregg et al. |
| 2005/0059240 A1 | 3/2005 | Choi et al. |
| 2005/0064207 A1 | 3/2005 | Senzaki et al. |
| 2005/0070126 A1 | 3/2005 | Senzaki |
| 2005/0092247 A1* | 5/2005 | Schmidt et al. ............ 118/715 |
| 2005/0095859 A1 | 5/2005 | Chen et al. |
| 2005/0104142 A1 | 5/2005 | Narayanan et al. |
| 2005/0115675 A1 | 6/2005 | Tzu et al. |
| 2005/0139160 A1 | 6/2005 | Lei et al. |
| 2005/0139948 A1 | 6/2005 | Chung et al. |
| 2005/0153571 A1 | 7/2005 | Senzaki |
| 2005/0173068 A1 | 8/2005 | Chen et al. |
| 2005/0189072 A1 | 9/2005 | Chen et al. |
| 2005/0208217 A1 | 9/2005 | Shinriki et al. |
| 2005/0229969 A1 | 10/2005 | Nguyen et al. |
| 2005/0233156 A1 | 10/2005 | Senzaki et al. |
| 2005/0252449 A1 | 11/2005 | Nguyen et al. |
| 2005/0255243 A1 | 11/2005 | Senzaki |
| 2005/0257735 A1 | 11/2005 | Guenther |
| 2005/0271812 A1 | 12/2005 | Myo et al. |
| 2005/0271814 A1 | 12/2005 | Chang et al. |
| 2006/0018639 A1 | 1/2006 | Ramamurthy et al. |
| 2006/0035025 A1 | 2/2006 | Verplancken et al. |
| 2006/0075966 A1 | 4/2006 | Chen et al. |
| 2006/0156979 A1 | 7/2006 | Thakur et al. |
| 2006/0213557 A1 | 9/2006 | Ku et al. |
| 2006/0213558 A1 | 9/2006 | Ku et al. |
| 2006/0223286 A1 | 10/2006 | Chin et al. |
| 2006/0257295 A1 | 11/2006 | Chen et al. |
| 2007/0020890 A1 | 1/2007 | Thakur et al. |
| 2007/0044719 A1 | 3/2007 | Ku et al. |
| 2007/0067609 A1 | 3/2007 | Chen et al. |
| 2007/0079759 A1 | 4/2007 | Lee et al. |
| 2007/0089817 A1 | 4/2007 | Ganguli et al. |
| 2007/0095285 A1 | 5/2007 | Thakur et al. |
| 2007/0110898 A1 | 5/2007 | Ganguli et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2007/0151514 A1 | 7/2007 | Chen et al. |
| 2007/0235085 A1 | 10/2007 | Nakashima et al. |
| 2007/0252500 A1 | 11/2007 | Ranish et al. |
| 2008/0202425 A1* | 8/2008 | Gelatos et al. ............ 118/724 |
| 2008/0206987 A1* | 8/2008 | Gelatos et al. ............ 438/654 |

FOREIGN PATENT DOCUMENTS

| | | |
|---|---|---|
| JP | 58098917 | 6/1983 |
| JP | 04291916 | 10/1992 |
| JP | 05047666 | 2/1993 |
| JP | 05206036 | 8/1993 |
| JP | 05234899 | 9/1993 |
| JP | 05270997 | 10/1993 |
| JP | 06224138 | 8/1994 |
| JP | 2000212752 | 8/2000 |
| JP | 2000319772 | 11/2000 |
| JP | 2001020075 | 1/2001 |
| WO | WO-9617107 | 6/1996 |
| WO | WO-9901595 | 1/1999 |
| WO | WO-9965064 | 12/1999 |
| WO | WO-0054320 | 9/2000 |
| WO | WO-0079576 | 12/2000 |
| WO | WO-0117692 | 3/2001 |
| WO | WO-0136702 | 5/2001 |
| WO | WO-0208488 | 1/2002 |
| WO | WO-0245871 | 6/2002 |
| WO | WO-03023835 | 3/2003 |
| WO | WO-2004008491 | 1/2004 |
| WO | WO-2004106584 | 12/2004 |

* cited by examiner

TEMPERATURE CONTROLLED LID ASSEMBLY FOR TUNGSTEN NITRIDE DEPOSITION

CROSS-REFERENCE TO RELATED APPLICATIONS

This application claims benefit of U.S. Ser. No. 60/887,142, filed Jan. 29, 2007, and U.S. Ser. No. 60/944,085, filed Jun. 14, 2007, which are herein incorporated by reference in their entirety.

BACKGROUND OF THE INVENTION

1. Field of the Invention

Embodiments of the invention generally relate to a temperature controlled lid assembly for a processing chamber and a method for depositing tungsten-containing materials on a substrate by vapor deposition processes.

2. Description of the Related Art

Modern integrated circuits contain large numbers of transistors. These transistors are generally field effect transistors that contain a source region and a drain region with a gate electrode located in between the source and drain regions.

A typical gate structure contains a thin polysilicon electrode that lies on top of a thin layer of gate oxide such as silicon oxide. The gate electrode and gate oxide are formed between semi-conducting source and drain regions, that define an underlying well of p-type or n-type silicon. The source and drain regions are doped opposite to the well to define the gate location, a layer of insulating material such as silicon oxide, silicon nitride, or silicon oxynitride is deposited on top of the source and drain regions and an aperture or via is formed in the insulating material between the source and drain regions. The gate structure within the via contains a thin oxide layer, a polysilicon layer and a metal plug. The metal plug is typically formed by vapor depositing a metal such as tungsten on top of the polysilicon gate electrode. To complete the connection, the silicon then is caused to diffuse into the tungsten during a thermal annealing process forming a layer of relatively uniform tungsten silicide as the connection to the gate electrode. Without annealing, the silicon will ultimately diffuse into the tungsten forming a non-uniform layer of tungsten silicide.

A gate electrode having an electrical connection made of pure tungsten would be more desirable than a tungsten silicide electrode since tungsten has a lower resistivity than tungsten silicide. Unfortunately, silicon diffuses into the tungsten forming tungsten silicide. The diffusion can be prevented by depositing a layer of tungsten nitride as a diffusion barrier between the tungsten and the silicon. Tungsten nitride is a good conductor as well as an excellent diffusion barrier material. Such a barrier layer is typically formed by reducing tungsten hexafluoride ($WF_6$) with ammonia ($NH_3$) in a chemical vapor deposition (CVD) process or an atomic layer deposition (ALD) process.

Unfortunately, the above described process results in the formation of contaminant particles in the form of solid byproducts. These byproducts include ammonia adducts of tungsten hexafluoride (($NH_3)_4 \cdot WF_6$), ammonium fluoride ($NH_4F$), and other ammonium complexes. Many of these particles become attached to the interior of the deposition chamber. During temperature fluctuations within the chamber, the deposits flake off the walls and contaminate the wafer. Further, the tungsten nitride that is deposited using the above described process has a polycrystalline structure in which there are many grain boundaries. As a result, the diffusion barrier properties of the tungsten nitride are compromised. In addition, tungsten nitride films deposited by the traditional method tend not to adhere very well to the substrate upon which they are deposited.

Therefore, there is a need for an apparatus and a process for depositing tungsten-containing materials, wherein a tungsten precursor may be flowed with or exposed to another reagent without contaminating the processing chamber or the substrate surface.

SUMMARY OF THE INVENTION

In one embodiment, a processing chamber for depositing a material by vapor deposition is provided which includes a lid assembly attached to a chamber body, wherein the lid assembly contains a lid plate, a showerhead, a mixing cavity, and a distribution cavity, and a resistive heating element contained within the lid plate. In one example, the resistive heating element is configured to provide the lid plate at a temperature within a range from about 120° C. to about 180° C., preferably, from about 140° C. to about 160° C., more preferably, from about 145° C. to about 155° C., such as about 150° C. The mixing cavity is in fluid communication with a tungsten precursor source and a nitrogen precursor source, wherein the tungsten precursor source generally contains tungsten hexafluoride and the nitrogen precursor source generally contains ammonia. In some embodiments, the lid assembly further contains a liquid channel attached to a temperature regulating system. Also, the chamber body further contains a substrate support pedestal having a heater.

In another embodiment, a processing chamber for depositing a tungsten-containing material by vapor deposition is provided which includes a lid assembly attached to a chamber body, wherein the lid assembly contains a lid plate, a showerhead, a mixing cavity, and a distribution cavity, a resistive heating element contained within the lid plate, a tungsten precursor source coupled to and in fluid communication with the lid assembly, and a nitrogen precursor source coupled to and in fluid communication with the lid assembly.

In other embodiments, the processing chamber contains a reducing agent precursor source coupled to and in fluid communication with the lid assembly. The reducing agent precursor source contains a reducing agent, such as silane, hydrogen, diborane, disilane, phosphine, derivatives thereof, or combinations thereof. In one embodiment, a first valve is positioned between the tungsten precursor source and the lid assembly, a second valve is positioned between the nitrogen precursor source and the lid assembly, and a third valve is positioned between the reducing agent precursor source and the lid assembly. Each of the first valve, the second valve, and the third valve is independently controlled by a programmable logic controller. In one example, the programmable logic controller is configured to sequentially open and close the first and third valves while forming a tungsten nucleation layer during an atomic layer deposition process. In another example, the programmable logic controller is configured to simultaneously open and close the first and second valves while forming a tungsten nitride layer during a chemical vapor deposition process. In another example, the programmable logic controller is configured to sequentially open and close the first and second valves while forming a tungsten nitride layer during a second atomic layer deposition process. In another example, the programmable logic controller is configured to open and close the third valve during a pre-nucleation soak process or a post-nucleation soak process.

In one embodiment, a method for forming a tungsten-containing material on a substrate is provided which includes positioning a substrate within a processing chamber comprising a lid plate, heating the lid plate to a temperature within a range from about 120° C. to about 180° C., depositing a tungsten nitride layer on the substrate during a vapor deposition process within the processing chamber, and depositing a tungsten nucleation layer on the tungsten nitride layer during an atomic layer deposition process within the processing chamber.

In another embodiments, a method for forming a tungsten-containing material on a substrate is provided which includes positioning a substrate within a processing chamber containing a lid plate, heating the lid plate to a temperature within a range from about 120° C. to about 180° C., depositing a first tungsten nucleation layer on the substrate during a first atomic layer deposition process within the processing chamber, depositing a tungsten nitride layer on the first tungsten nucleation layer during a vapor deposition process within the processing chamber, and depositing a second tungsten nucleation layer on the tungsten nitride layer during a second atomic layer deposition process within the processing chamber.

In another embodiments, a method for forming a tungsten-containing material on a substrate is provided which includes positioning a substrate within a processing chamber containing a lid plate, heating the lid plate to a temperature within a range from about 120° C. to about 180° C., exposing the substrate to a reducing gas during a pre-nucleation soak process, depositing a first tungsten nucleation layer on the substrate during a first atomic layer deposition process within the processing chamber, depositing a tungsten nitride layer on the first tungsten nucleation layer during a vapor deposition process within the processing chamber, and depositing a second tungsten nucleation layer on the tungsten nitride layer during a second atomic layer deposition process within the processing chamber.

In another embodiments, a method for forming a tungsten-containing material on a substrate is provided which includes positioning a substrate within a processing chamber containing a lid plate, heating the lid plate to a temperature within a range from about 120° C. to about 180° C., exposing the substrate to a reducing gas during a pre-nucleation soak process, depositing a first tungsten nucleation layer on the substrate during a first atomic layer deposition process within the processing chamber, depositing a tungsten nitride layer on the first tungsten nucleation layer during a vapor deposition process within the processing chamber, depositing a second tungsten nucleation layer on the tungsten nitride layer during a second atomic layer deposition process within the processing chamber, and exposing the substrate to another reducing gas during a post-nucleation soak process.

In other embodiments, the method provides that the lid plate is heated to a temperature within a range from about 140° C. to about 160° C., preferably, from about 145° C. to about 155° C., more preferably, at about 150° C. The tungsten nitride layer may be deposited during a chemical vapor deposition process, wherein a tungsten precursor and a nitrogen precursor are co-flowed during the chemical vapor deposition process. In one embodiment, the tungsten precursor contains tungsten hexafluoride and the nitrogen precursor contains ammonia.

In other embodiments, the method provides that the substrate is exposed to a reducing agent during the pre-nucleation soak process or the post-nucleation soak process. The reducing agent may contain silane, hydrogen, diborane, disilane, phosphine, derivatives thereof, or combinations thereof.

Other examples provide that a bulk tungsten layer is deposited on the tungsten nucleation layer during a thermal chemical vapor deposition process.

In other embodiments, an angled mixer and a lid assembly that may be utilized on a processing chamber are disclosed herein. The lid assembly may have both heating elements and cooling channels to permit rapid heating and cooling of the chamber lid so that multiple depositions may occur within the same processing chamber at different temperatures. The mixer may be angled to be disposed within a central area of the lid assembly. The mixer may have an opening at the top to permit cleaning gas to enter the processing chamber, a second opening to permit introduction of a first deposition gas, and a third opening to permit introduction of a second deposition gas perpendicular to the flow of the first deposition gas so that the first and second deposition gases effectively mix within the mixer before being exposed to the substrate.

In one embodiment, a mixer contains a mixer body having a base portion, a shaft portion substantially perpendicular to the base portion, one or more first gas introduction holes having a first diameter along the shaft portion, and one or more second gas introduction holes having a second diameter less than the first diameter disposed along the shaft portion.

In another embodiment, a lid assembly contains one or more heating elements, one or more cooling channels, a hole disposed about the center axis of the lid assembly and through the lid assembly, a notch disposed adjacent to and coupled with the hole, and a cavity disposed adjacent to and coupled with the hole.

In another embodiment, a lid assembly contains a lid body and a mixer body coupled with the lid body. The lid body contains one or more heating elements, one or more cooling channels, and a notch disposed within an upper surface of the lid body. The a mixer body contains a base portion, a shaft portion substantially perpendicular to the base portion, one or more first gas introduction holes having a first diameter along the shaft portion, and one or more second gas introduction holes having a second diameter less than the first diameter disposed along the shaft portion.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention provide a processing chamber for depositing a material by vapor deposition. In one embodiment, the processing chamber includes a lid assembly attached to a chamber body, wherein the lid assembly contains a lid plate, a showerhead, a mixing cavity, a distribution cavity, and a resistive heating element contained within the lid plate. In one example, the resistive heating element is configured to provide the lid plate at a temperature within a range from about 120° C. to about 180° C., preferably, from about 140° C. to about 160° C., more preferably, from about 145° C. to about 155° C., such as about 150° C. The mixing cavity is in fluid communication with a tungsten precursor source and a nitrogen precursor source, wherein the tungsten precursor source generally contains tungsten hexafluoride and the nitrogen precursor source generally contains ammonia.

Embodiments of the apparatuses and processes as described herein are useful to deposit tungsten-containing materials while avoiding contamination of the processing chamber or substrate of various byproducts, including ammonia adducts of tungsten hexafluoride (($NH_3$)$_4$.$WF_6$), ammonium fluoride ($NH_4F$), and other ammonium complexes.

Embodiments of the invention provide an angled mixer and lid assembly for a processing chamber. The lid assembly may have both heating elements and cooling channels to permit rapid heating and cooling of the chamber lid so that multiple depositions may occur within the same processing chamber at different temperatures. The mixer may be angled to be disposed within a central area of the lid assembly. The mixer may have an opening at the top to permit a cleaning gas to enter the processing chamber, a second opening to permit introduction of a first deposition gas, and a third opening to permit introduction of a second deposition gas perpendicular to the flow of the first deposition gas so that the first and second deposition gases effectively mix within the mixer before being exposed to the substrate.

As described below, the angled mixer and the lid assembly may be used to form tungsten-containing materials by vapor deposition processes as described herein. The tungsten-containing materials may contain metallic tungsten, tungsten nitride, tungsten silicide, tungsten boride, tungsten phosphide, derivatives thereof, or combinations thereof. A processing chamber may be used to perform chemical vapor deposition (CVD), plasma-enhanced CVD (PE-CVD), pulsed-CVD, atomic layer deposition (ALD), plasma-enhanced ALD (PE-ALD), derivatives thereof, or combinations thereof. Processing chambers for CVD and ALD processes are commercially available from Applied Materials, Inc., located in Santa Clara, Calif. In some embodiments, the processing chamber for depositing tungsten-containing materials may contain an in situ plasma source or a remote plasma source.

Figure 1:
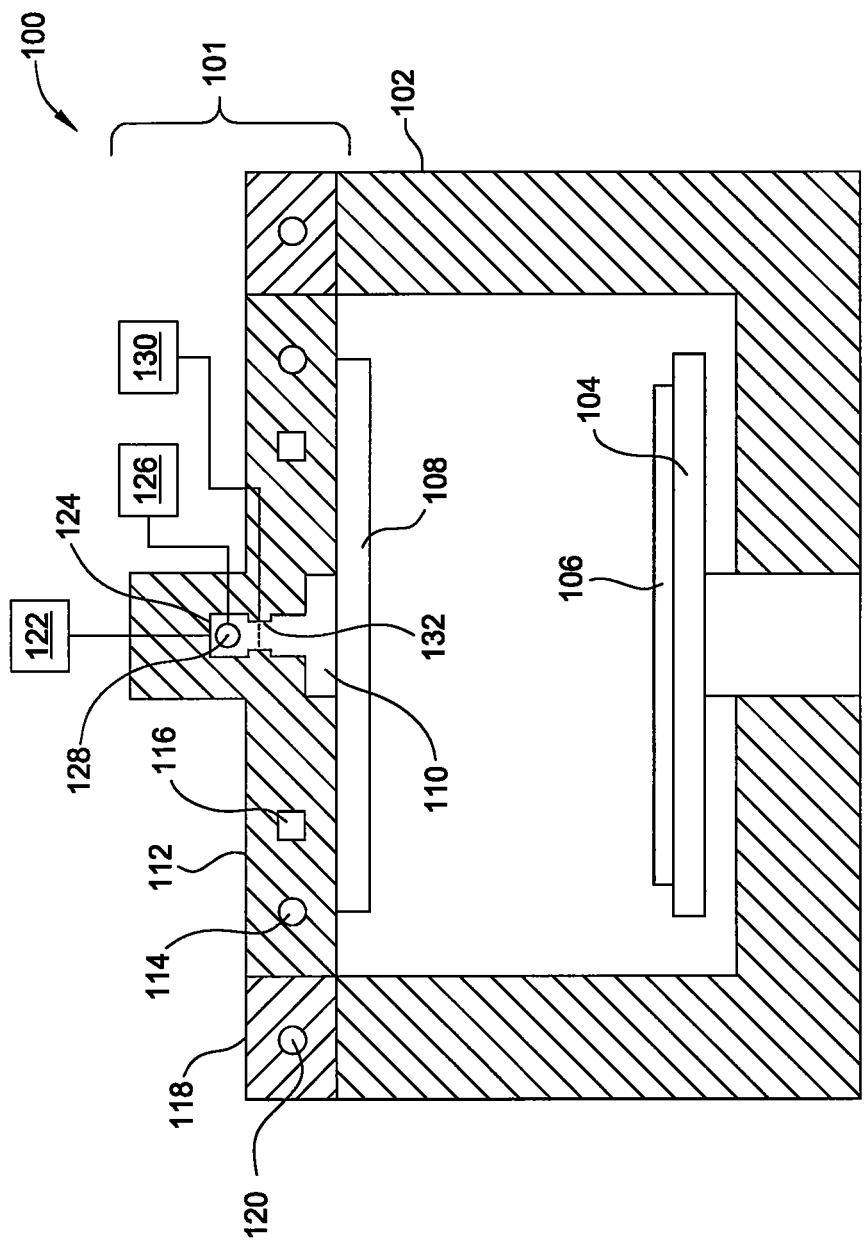
FIG. 1 depicts a schematic cross sectional view of a processing chamber having a lid assembly and mixer according to an embodiment described herein.

FIG. 1 is a schematic cross sectional view of processing chamber 100 having lid assembly 101 and angled mixer 110 according to one embodiment of the invention. Processing chamber 100 contains chamber body 102 with susceptor 104 for supporting substrate 106 opposite showerhead 108. Chamber body 102 may be enclosed by two lids, such as inner lid 112 and outer lid 118. Outer lid 118 may encircle the outside of chamber body 102 and may contain one or more cooling channels 120 to maintain the chamber body at a predetermined temperature. Chamber body 102, showerhead 108, inner lid 112, and outer lid 118 may independently be formed of or contain a metal, such as aluminum, stainless steel, or alloys thereof.

Inner lid 112 may also contain one or more cooling channels 114. Additionally, inner lid 112 may contain one or more heating elements 116. Both the cooling channels 114 and heating elements 116 may be embedded in inner lid 112. The presence of both heating elements 116 and cooling channels 114 in inner lid 112 permit the rapid increase in temperature and decrease in temperature that may be necessary to deposit both tungsten and tungsten nitride at different temperatures within the same processing chamber 100 as well as cleaning processing chamber 100.

Angled mixer 110 may be disposed within inner lid 112 for introduction of both deposition gases and cleaning gases into processing chamber 100. Cleaning gases may be provided from cleaning gas panel 122 through top 124 of angled mixer 110. A first deposition gas may be provided to angled mixer 110 from first gas panel 126 through opening 128 disposed on a side surface of angled mixer 110. A second deposition gas may be provided to angled mixer 110 from second gas panel 130 to notch 132 disposed in inner lid 112 adjacent angled mixer 110. Notch 132 permits the second gas to travel around the outside of angled mixer 110 and then inject into angled mixer 110 through one or more holes.

Figure 2A:
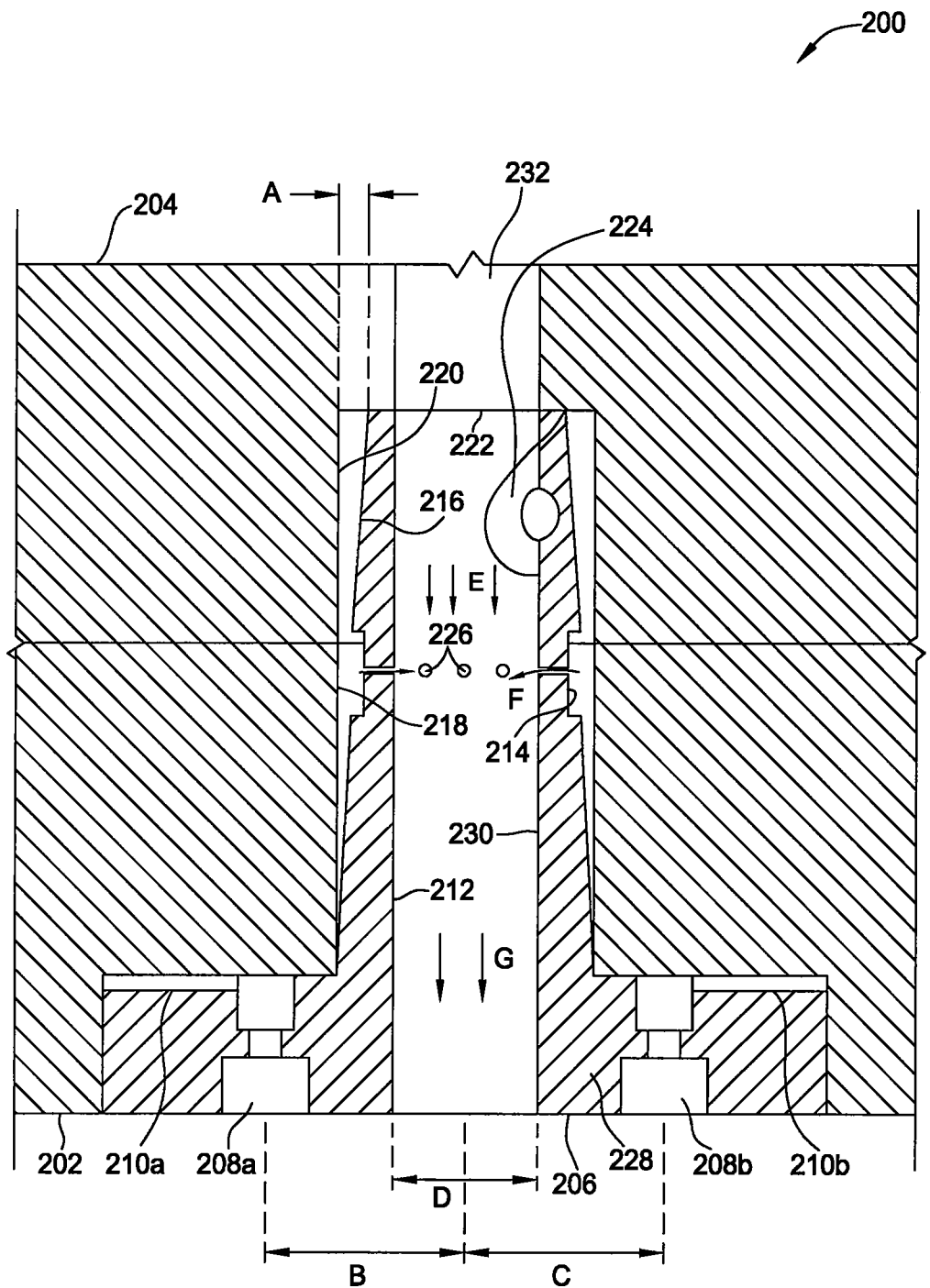
FIG. 2A depicts a schematic cross sectional view of an angled mixer according to another embodiment described herein.
Figure 2B:
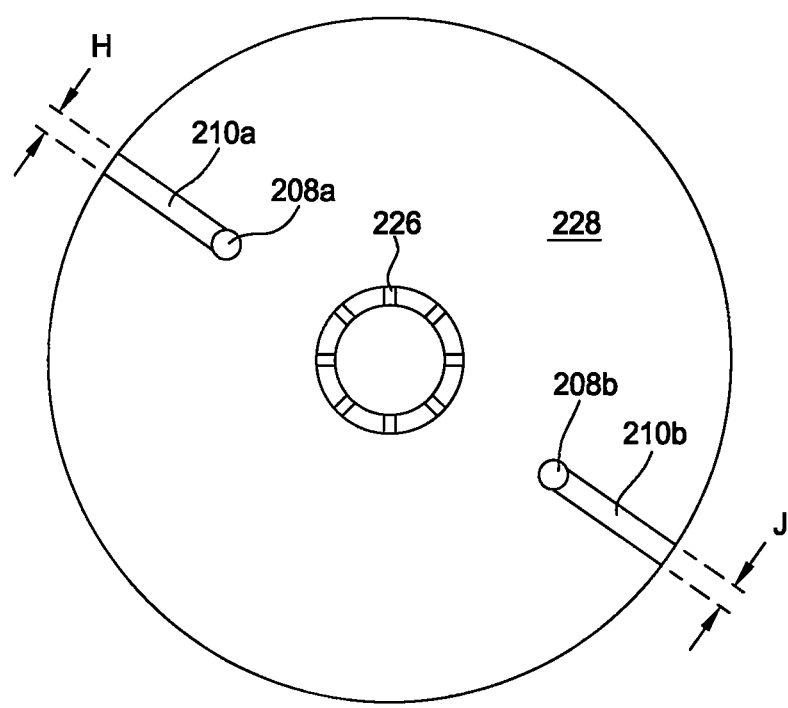
FIG. 2B depicts a top view of the angled mixer of FIG. 2A.
Figure 2C:
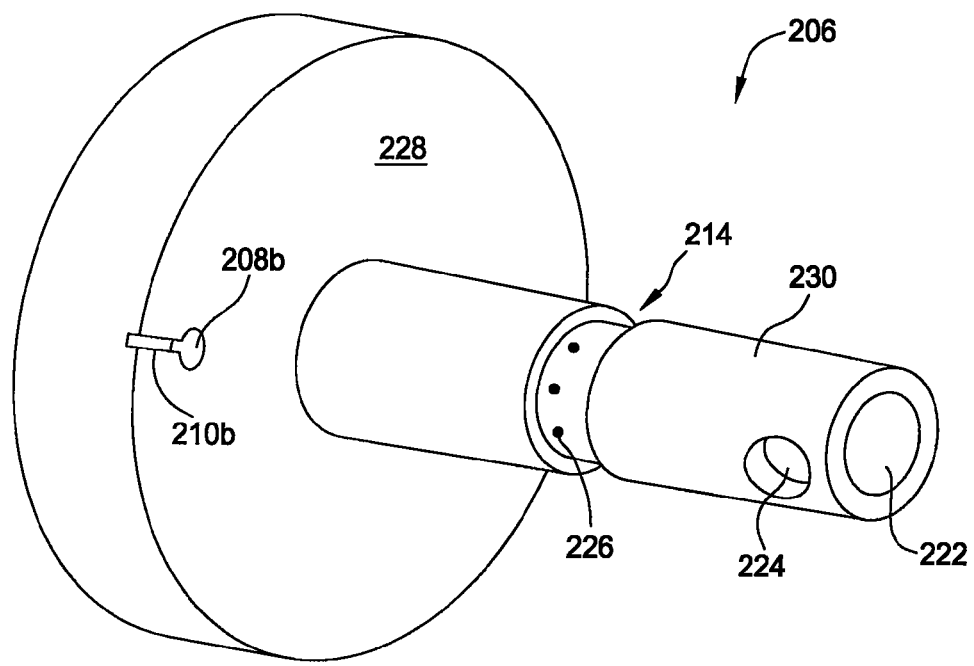
FIGS. 2C and 2D depict isometric views of the angled mixer of FIG. 2A.
Figure 2D:
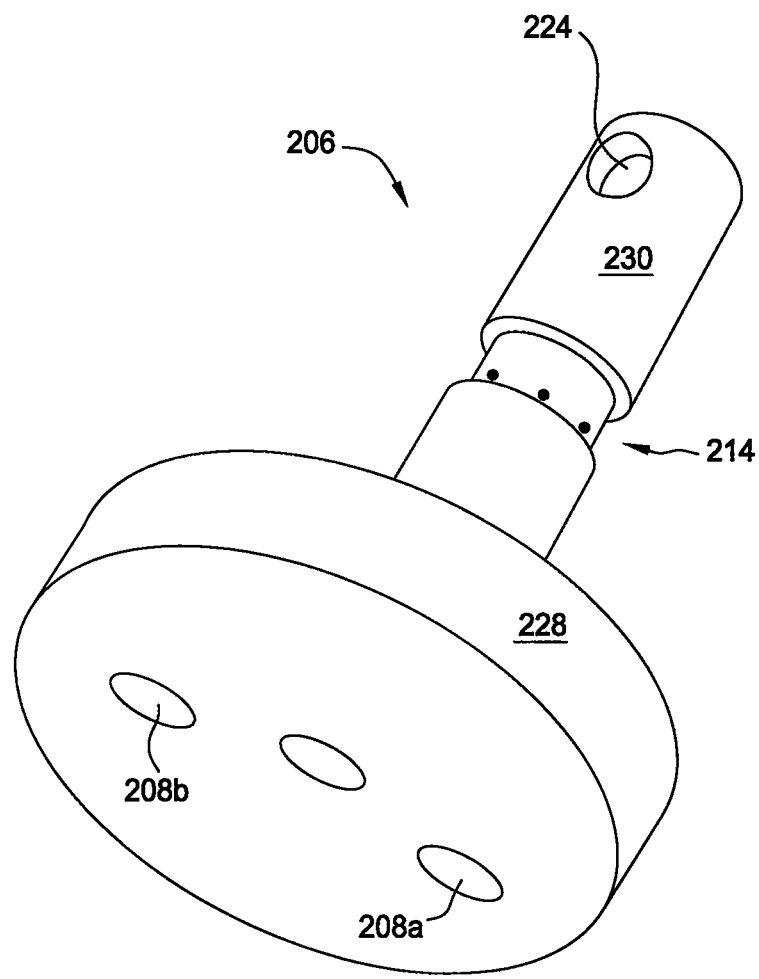

FIG. 2A is a schematic cross sectional view of angled mixer 206 according to one embodiment of the invention. FIGS. 2C and 2D are isometric views of angled mixer 206 of FIG. 2A. Angled mixer 206 may be disposed in lid assembly 200 having lid 202 and gas inlet manifold 204. Angled mixer 206 may extend through lid 202 and into gas inlet manifold 204. Angled mixer 206 may be coupled with lid 202 with one or more fastening mechanisms disposed through openings 208a and 208b in base portion 228 of angled mixer 206. One or more vacuum channels 210a and 210b may be coupled with openings 208a and 208b to permit drawing a vacuum and pulling angled mixer 206 into tight contact with lid 202. Vacuum channels 210a and 210b may have different widths as shown by arrows "H" and "J" in FIG. 2B.

In one embodiment, the ratio of the widths of vacuum channels 210a and 210b may be within a range from about 1.6 to about 2.0, preferably, from about 1.75 to about 1.95, and more preferably, from about 1.85 to about 1.90. In one example, the ratio of the widths of vacuum channels 210a and 210b may be about 1.875. Openings 208a and 208b may be offset on angled mixer 206 such that one opening 208a may be spaced a distance "B" from the center of angled mixer 206 and the other opening 208b may be spaced a second, different distance "C" from the center of angled mixer 206. In one embodiment, the ratio of the distance "C" to the distance "B" may be about 1.3. Openings 208a and 208b may be offset so angled mixer 206 may be coupled with lid 202 in the correct orientation.

Angled mixer 206 also contains shaft portion 230 having inner wall 212 having a substantially constant diameter "D" and outer wall 216 that is angled relative to inner wall 212. Additionally, outer wall 216 is angled relative to wall 218 of lid 202 and wall 220 of gas inlet manifold 204. Outer wall 216 is angled as shown by arrows "A". The angled outer wall 216 relative to the substantially straight walls 218 and 220 of lid 202, and gas inlet manifold 204 respectively permit angled mixer 206 to be easily inserted into lid assembly 200 without outer wall 216 scraping walls 218 and 220 while also permitting a tight fit at a location corresponding to where shaft portion 230 meets base portion 228 of angled mixer 206.

A cleaning gas may be introduced to the processing chamber through opening 222 in angled mixer 206 that is coupled with a cleaning gas introduction tube 232. Opening 222 may be disposed at the top of shaft portion 230 of angled mixer 206 such that the cleaning gas may clean the entire angled mixer 206. A first deposition gas may be provided to angled mixer 206 through opening 224 in shaft portion 230 of angled mixer 206. The first deposition gas flows downward through shaft portion 230 of angled mixer 206 as shown by the arrows "E". A second deposition gas may be introduced to notch 214 formed between outer wall 216 of shaft portion 230 of angled mixer 206 and walls 218 and 220 of lid 202 and gas inlet manifold 204. The second deposition gas may flow around the outside of angled mixer 206 and then inject into angled mixer 206 through holes 226 formed in notch 214 of shaft portion 230 in a direction substantially perpendicular to the flow of the first deposition gas as shown by the arrows "F". In one embodiment, eight holes 226 may be present. The cross-flow of the second deposition gas may permit the first and secondary gases to sufficiently mix as they collectively flow down through angled mixer 206 as shown by the arrows "G". In one embodiment, the diameter of holes 226 is less than the diameter of opening 224. Opening 222 may have a diameter that is different than the diameter of opening 224 and holes 226.

Figure 3A:
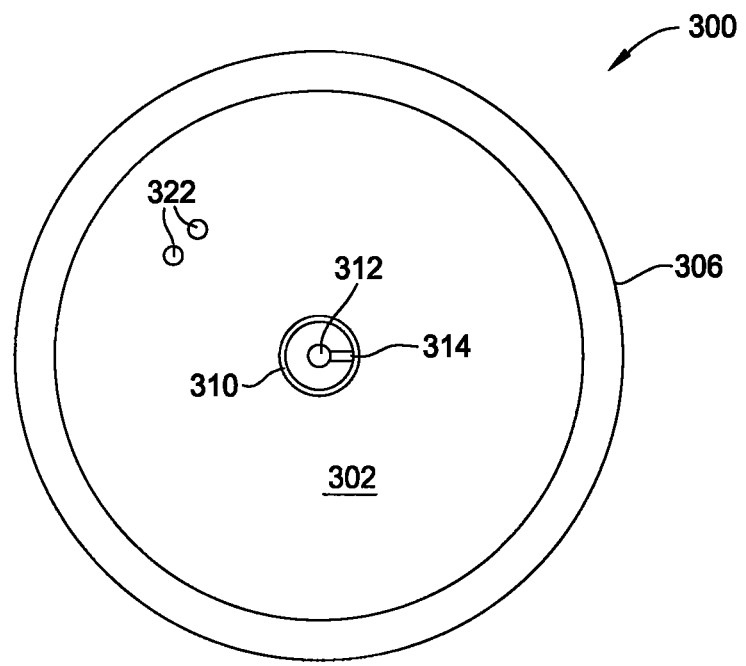
FIG. 3A depicts a top view of a secondary lid assembly according to another embodiment described herein.
Figure 3B:
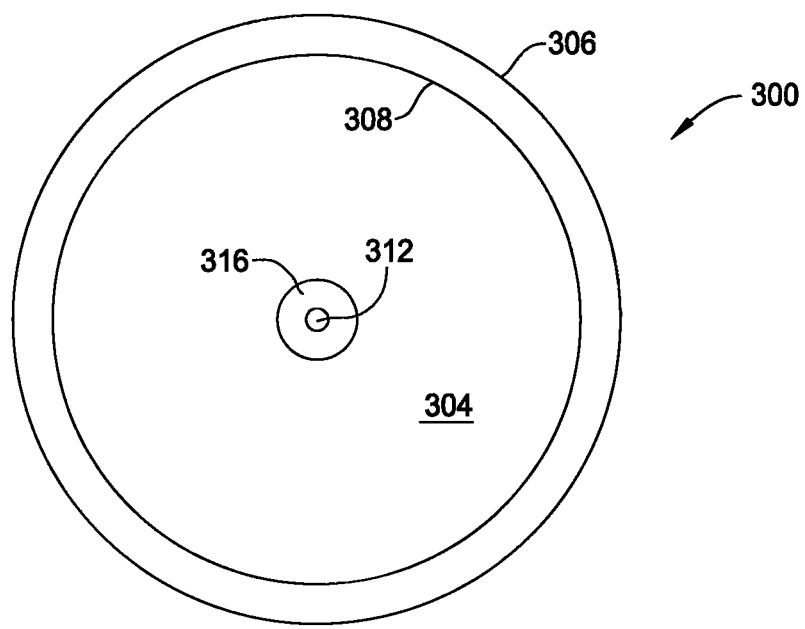
FIG. 3B depicts a bottom view of the lid assembly of FIG. 3A.
Figure 3C:
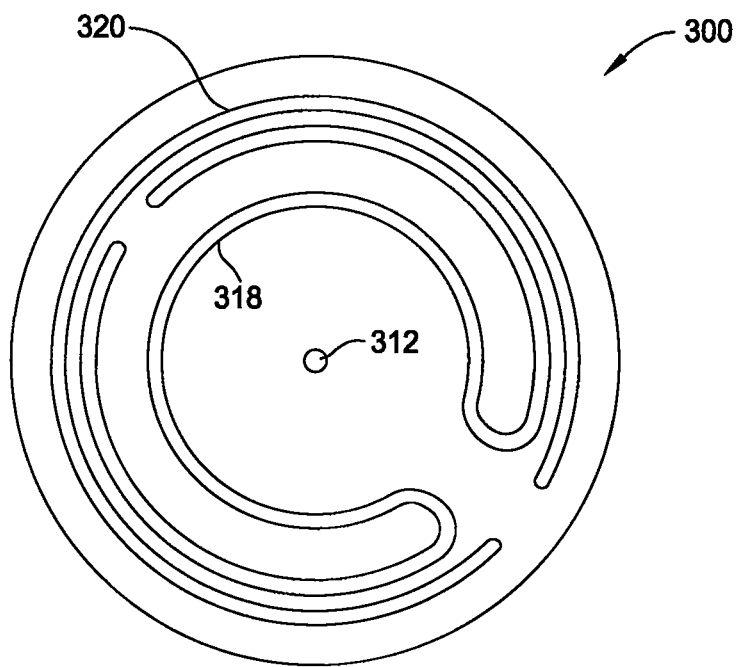
FIG. 3C depicts a bottom cross sectional view of the lid assembly of FIG. 3A.
Figure 3D:
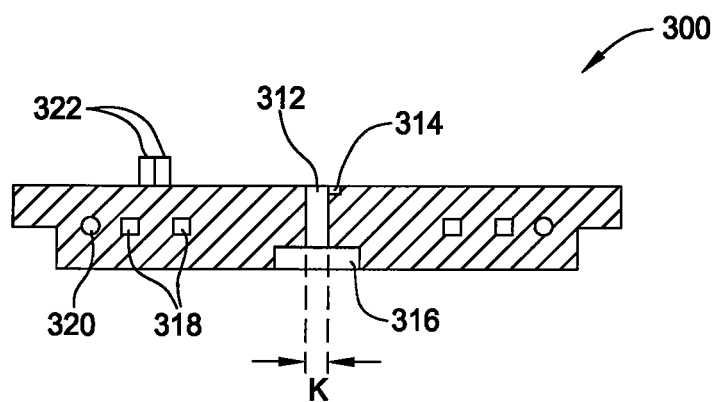
FIG. 3D depicts a cross sectional view of the lid assembly of FIG. 3A.

FIG. 3A is a top view of lid assembly 300 according to one embodiment of the invention. FIG. 3B is a bottom view of lid assembly 300 of FIG. 3A. FIG. 3C is a bottom cross sectional view of lid assembly 300 of FIG. 3A. FIG. 3D is a cross sectional view of lid assembly 300 of FIG. 3A. Lid assembly 300 contains top portion 302 having a non-circular outer wall 306 and bottom portion 304 having a substantially circular outer wall 308. In one embodiment, top portion 302 and bottom portion 304 are a unitary piece. In another embodiment, top portion 302 and bottom portion 304 are separate pieces coupled together. Hole 312 may be present through lid assembly 300 to permit insertion of a mixer. Hole 312 may be substantially cylindrically shaped and have a substantially uniform diameter as shown by arrows "K". Therefore, a mixer inserted into hole 312 tightly fits therein.

Notch 314 may be present to permit deposition gas to be provided to the mixer once inserted into lid assembly 300. Sealing cavity 310 may be present to permit lid assembly 300 to be coupled with a gas inlet manifold (not shown). A cavity portion 316 may be present for the base portion of a mixer to be coupled to lid assembly 300.

Heating element 318 may be disposed within lid assembly 300 to heat the processing gas and lid assembly 300. Heating element 318 may have multiple turns and winds through lid assembly 300 and may even turn back upon itself. In one embodiment, heating element 318 may contain aluminum. Heating elements 318 containing aluminum may be beneficial because the aluminum, as compared to conventional stainless steel heating elements, may prevent warping. One or more cooling channels 320 may also be present outside heating element 318 to rapidly cool lid assembly 300. One or more thermocouples 322 may be coupled with the lid to measure the temperature of lid assembly 300. Having both heating elements 318 and cooling channels 320 coupled within the same lid permits the rapid cooling and rapid heating necessary to perform both tungsten and tungsten nitride deposition with the same processing chamber. The rapid heating and cooling can permit successive deposition processes of tungsten and tungsten nitride to occur within the same chamber without sacrificing throughput.

In one embodiment, cooling channels 320 may be used to regulate the temperature of lid assembly 300 during the vapor deposition process for depositing a tungsten-containing material. In one embodiment, lid assembly 101 may be heated or maintained at a temperature within a range from about 120° C. to about 180° C., preferably, from about 140° C. to about 160° C., and more preferably, from about 145° C. to about 155° C., such as about 150° C., during the vapor deposition process of a tungsten-containing material.

Temperature control may be useful to deposit both metallic tungsten and tungsten nitride materials in the same chamber. For example, to deposit metallic tungsten, lid assembly 300 may be maintained at a temperature of about 25° C. Thus, during tungsten deposition, heating elements 318 may be turned off and lid assembly 300 may be cooled by flowing a cooling fluid through cooling channel 320. The cooling fluid may contain water, glycol based fluid, or combinations thereof. Following the tungsten deposition, the chamber may be purged of the tungsten deposition gases. During the purging, the cooling fluid may be turned off and removed from cooling channel 320 by forcing air or an inert gas through cooling channel 320. The tungsten nitride deposition may occur at about 150° C. During the tungsten nitride deposition, heating elements 318 may be turned on while the cooling channel does not have a cooling fluid circulating therethrough.

A controller (not shown) may control the heating and cooling. A series of valves may be used to control when the cooling fluid is supplied to lid assembly 300. When the cooling fluid is supplied to lid assembly 300, heating element 318 may not be on. Similarly, when the cooling fluid is purged from cooling channel 320, heating element 318 may not be on. When the tungsten nitride is deposited, cooling fluid may not be supplied to lid assembly 300. When the cooling fluid is supplied to cooling channel 320, the air and/or inert gas may not be supplied to cooling channel 320. When the air and/or inert gas is supplied to cooling channel 320, cooling fluid may not be supplied to cooling channel 320. If the temperature of lid assembly 300 as measured by thermocouples 322 is greater than about 85° C., cooling fluid may not be supplied to the cooling channels 320. If the temperature of lid assembly 300 is greater than about 180° C., then heating elements 318 may be turned off. If the lid assembly temperature is greater than about 65° C., the chamber may not be vented.

In one embodiment, the primary lid discussed above in reference to FIG. 1 may be maintained at a temperature of about 25° C. during the tungsten nitride deposition. In one embodiment, the primary lid may be maintained at a temperature of about 65° C. The deposition of the tungsten nitride may occur at about 2 kW in power and about 10 amps. In another embodiment, the deposition of tungsten nitride may occur at about 3 kW in power and about 15 amps. An angled mixer disposed in a secondary lid assembly having both heating elements and cooling channels may permit deposition of tungsten and tungsten nitride within the same chamber.

Figure 4:
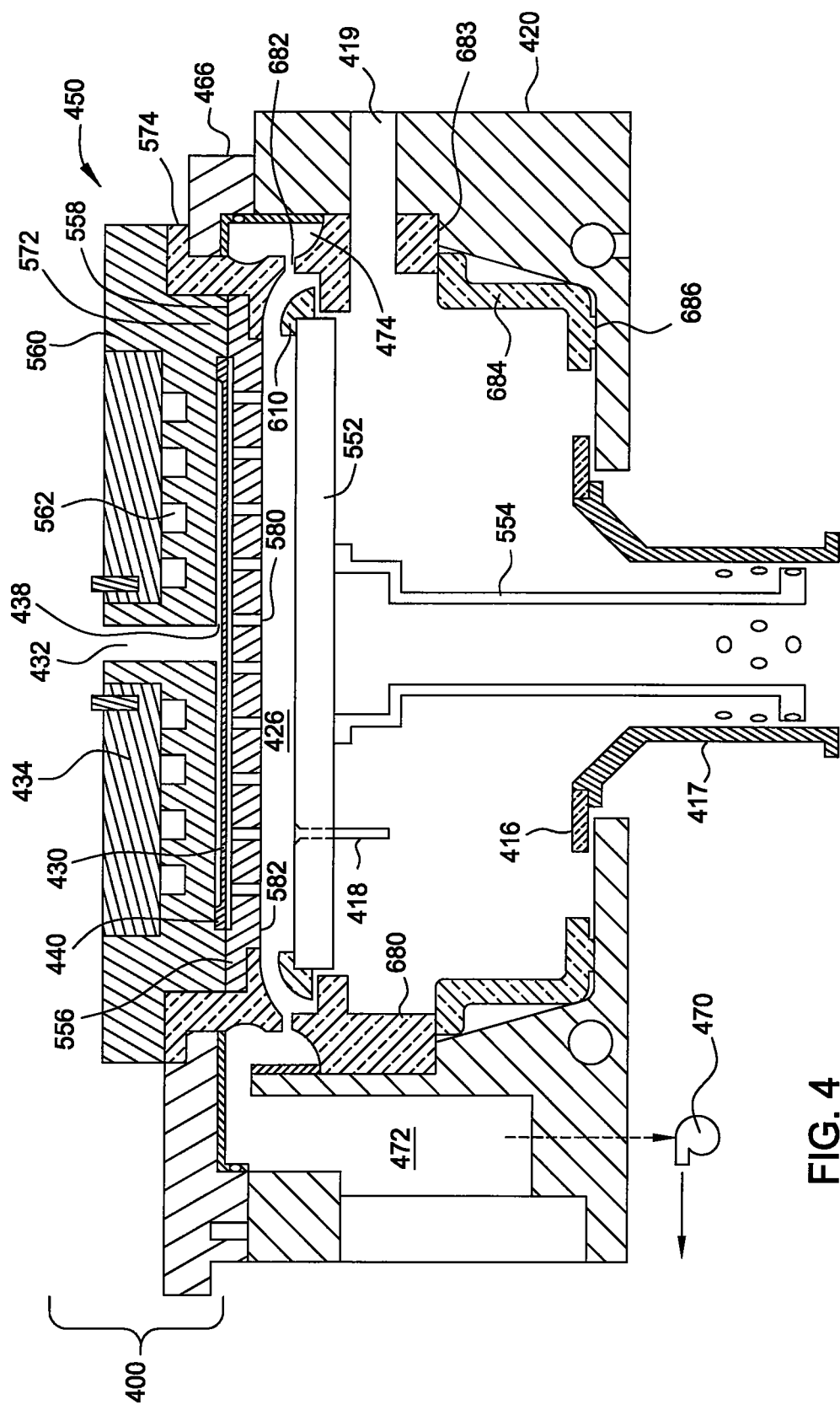
FIGS. 4-6 depict a schematic of a processing chamber according to other embodiments described herein.
Figure 5:
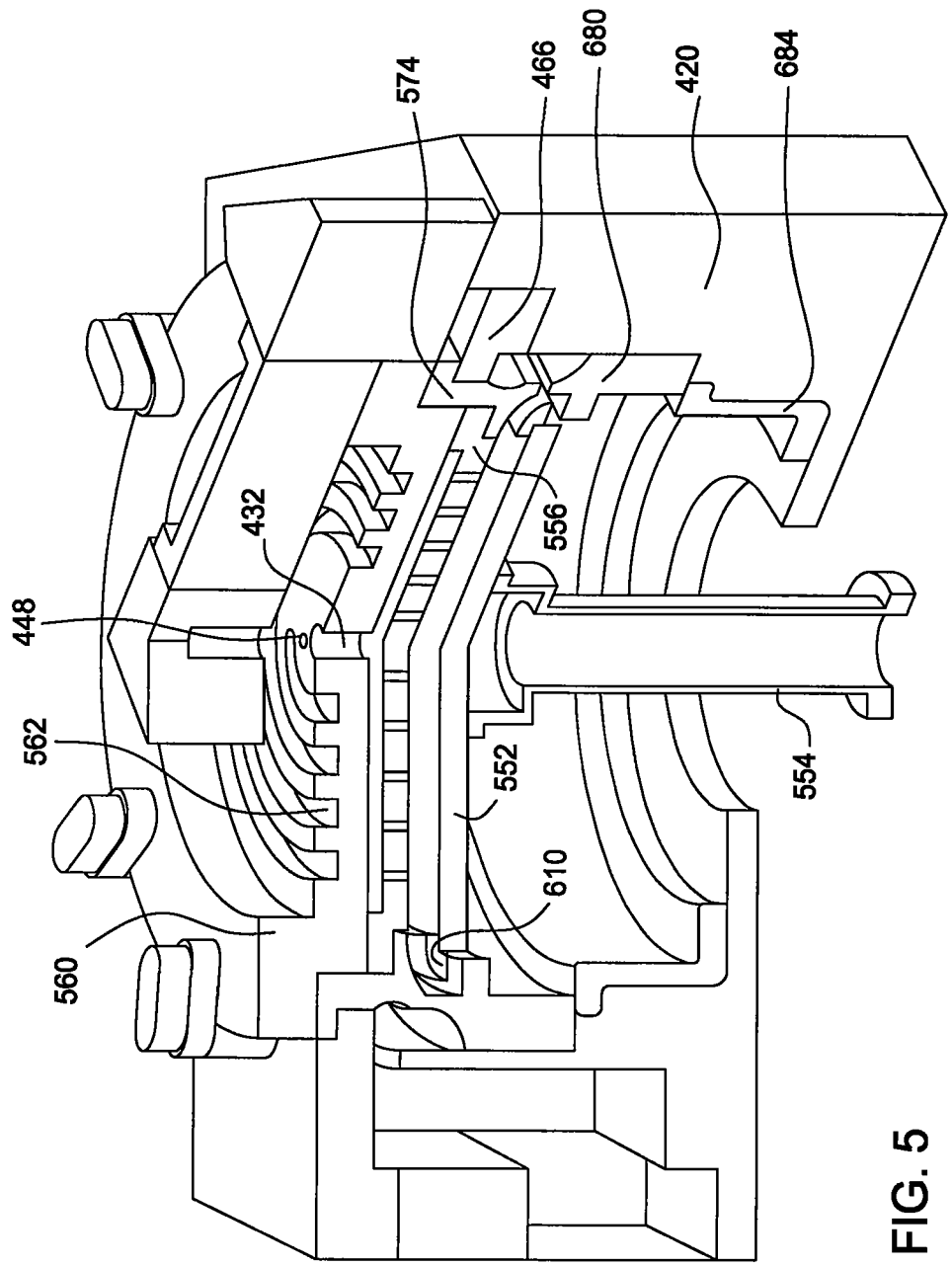
Figure 6:
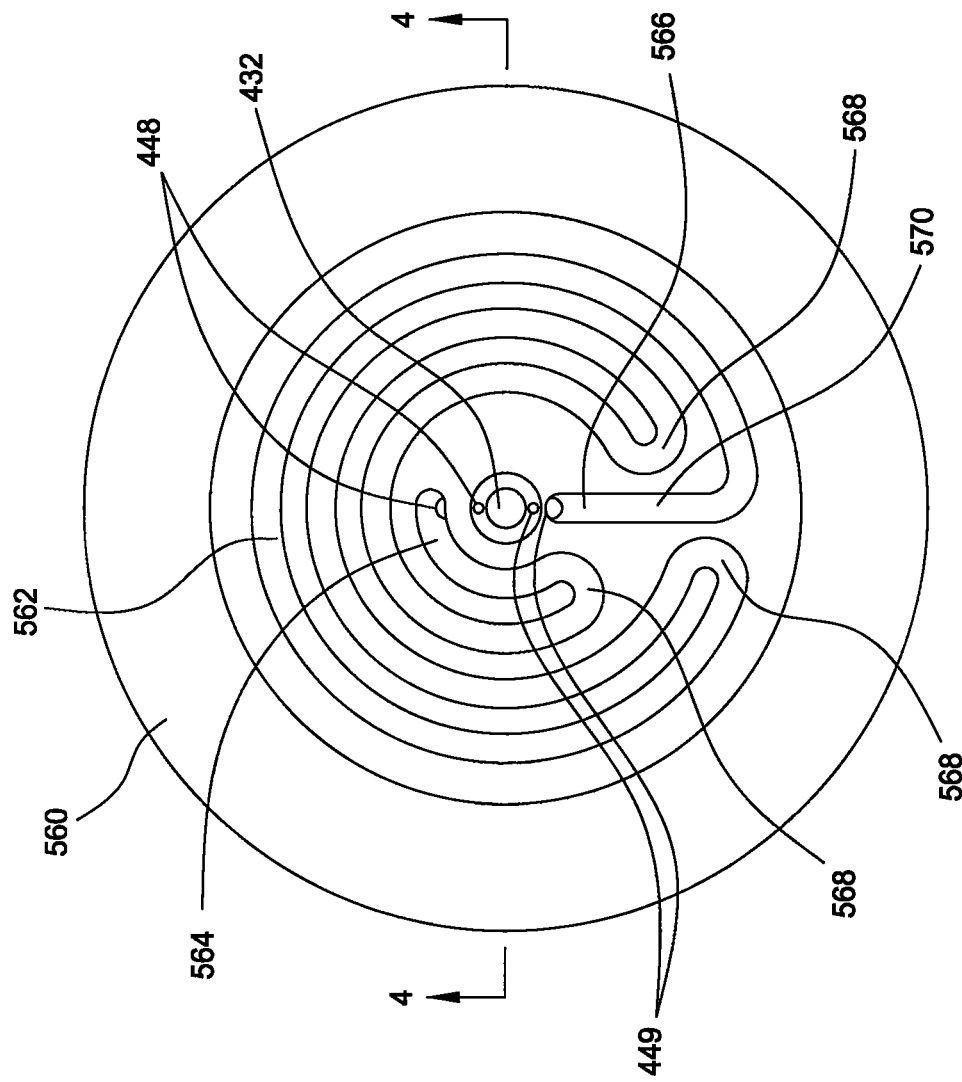

In another embodiment, FIGS. 4-6 illustrate processing chamber 450 that may be used to form tungsten-containing materials by vapor deposition process as described herein. The tungsten-containing materials may contain metallic tungsten, tungsten nitride, tungsten silicide, tungsten boride, tungsten phosphide, derivatives thereof, or combinations thereof. Processing chamber 450 may be used to perform CVD, PE-CVD, pulsed-CVD, ALD, PE-ALD, derivatives thereof, or combinations thereof. Water channels, such as convolute liquid channel 562, may be used to regulate the temperature of lid assembly 400 during the vapor deposition process for depositing a tungsten-containing material. In one embodiment, lid assembly 400 may be heated or maintained at a temperature within a range from about 120° C. to about 180° C., preferably, from about 140° C. to about 160° C., and more preferably, from about 145° C. to about 155° C., such as about 150° C., during the vapor deposition process of a tungsten-containing material.

Showerhead 556 has a relatively short upwardly extending rim 558 screwed to gas box plate 560. Both showerhead 556 and gas box plate 560 may be formed from or contain a metal, such as aluminum, stainless steel, or alloys thereof. Convolute liquid channel 562, illustrated in FIG. 6, is formed in the top of gas box plate 560 and covered and sealed by water cooling cover plate 434. Water is generally flown through convolute liquid channel 562. However, alcohols, glycol ethers, and other organic solvents may be used solely or mixed with water to transfer heat away from or to lid assembly 400. Water ports 448 and 449 through water cooling cover plate 434 are illustrated in FIGS. 4-5, water ports 448 and 449 connect ends 564 and 566 of liquid channel 562 near to the center of gas box plate 560. Convolute liquid channel 562 is formed in a serpentine though generally circumferential path having bends 568 (e.g., three sharp U-turns or U-shaped bends) as the path progresses from the inside to the outside until the path returns to the inside in radial channel 570. Liquid channel 562 is narrow enough and bends 568 are sharp enough to ensure that the flow of water becomes turbulent, thus aiding the flow of heat from the flange of gas box plate 560 to the water in channel 562. A liquid temperature regulating system (not shown) may be attached to water ports 448 and 449 and convolute liquid channel 562 and used to transfer heat away from or to lid assembly 400. In one example, lid assembly 400 is configured to be heated or maintained at a temperature of about 150° C. and is in fluid communication with a source of tungsten precursor (e.g., $WF_6$) and a source of a nitrogen precursor (e.g., $NH_3$).

FIGS. 4 and 5 depict upwardly extending rim 558 of showerhead 556 attached to bottom rim 572 of gas box plate 560. Both rims 558 and 572 are maximally sized between encompassing lid isolator 574 and encompassed lower cavity 430 of showerhead 556. The screw fastening between showerhead 556 and gas box plate 560 ensures good thermal contact over the maximally sized contact area. The thermal flow area extends from the outside at lid isolator 574 (except for a gap between lid isolator 574 and either showerhead 556 or gas box plate 560) to the inside at lower cavity 430. The structure of water cooling channels 562 provides efficient thermal transfer between the water and gas box plate 560, and the mechanical interface between the flange of gas box plate 560 and showerhead 556 ensures efficient thermal transfer between them. Accordingly, the cooling of showerhead 556 is greatly enhanced.

Processing chamber 450 further contains heater pedestal 552 connected to pedestal stem 554 that may be vertical moved within processing chamber 450. The heater portion of heater pedestal 552 may be formed of a ceramic. In its upper, deposition position, pedestal 552 holds the substrate in close opposition to lower surface 582 of showerhead 556, processing region 426 being defined between pedestal 552 and lower surface 582 of showerhead 556. Showerhead 556, has a large number of apertures or holes 580 communicating between lower cavity 430 and processing region 426 to allow the passage of processing gas. The processing gas is supplied through gas port 432 formed at the center of water-cooled gas box plate 560 made of aluminum. The upper side of gas box plate 560 is covered by water cooling cover plate 434 surrounding the upper portion of gas box plate 560 that includes gas port 432. Gas port 432 supplies the processing gases to upper cavity 438 separated from lower cavity 430 by blocker plate 440, also having a large number of holes 580 therethrough. One purpose of cavities 430 and 438, showerhead 556, and blocker plate 440 is to evenly distribute the processing gas over the upper face of the substrate.

The substrate may be supported on pedestal 552, which is illustrated in a raised, deposition position. In a lowered, loading position, lifting ring 416 attached to lift tube 417 lifts four lift pins 418 fit to slide into pedestal 552 so that lift pins 418 can receive the substrate loaded into the chamber through loadlock port 419 in chamber body 420. In one embodiment, pedestal 552 may contain an optional confinement ring 610, such as during plasma-enhanced vapor deposition processes.

Lid isolator 574 is interposed between showerhead 556 and lid rim 466, which can be lifted off chamber body 420 to open processing chamber 450 for maintenance access. The vacuum within processing chamber 450 is maintained by vacuum pump 470 connected to pump plenum 472 within processing chamber 450, which connects to annular pumping channel 474.

As illustrated in FIG. 4, annular chamber liner 680 made of quartz not only defines a side of pumping channel 474 but also partially defines a further choke aperture 682 between processing region 426 and pumping channel 474. Annular chamber liner 680 also supports confinement ring 610 in the lowered position of pedestal 552. Chamber liner 680 also surrounds a circumference at the back of pedestal 552. Chamber liner 680 rests on narrow ledge 683 in chamber body 420, but there is little other contact, so as to minimize thermal transport. Below chamber liner 680 is located a Z-shaped lower chamber shield 684, preferably made of opaque quartz. Lower chamber shield 684 rests on the bottom of chamber body 420 on annular boss 686 formed on the bottom of lower chamber shield 684. The quartz prevents radiative coupling between the bottom of pedestal 552 and chamber body 420, and annular boss 686 minimizes conductive heat transfer to chamber body 420. In an alternative embodiment, lower chamber shield 684 includes an inwardly extending bottom lip joined to a conically shaped upper portion conforming to the inner wall of chamber body 420. While this alternative design is operationally satisfactory, the sloping shape is much more expensive to fabricate in quartz.

Figure 7:
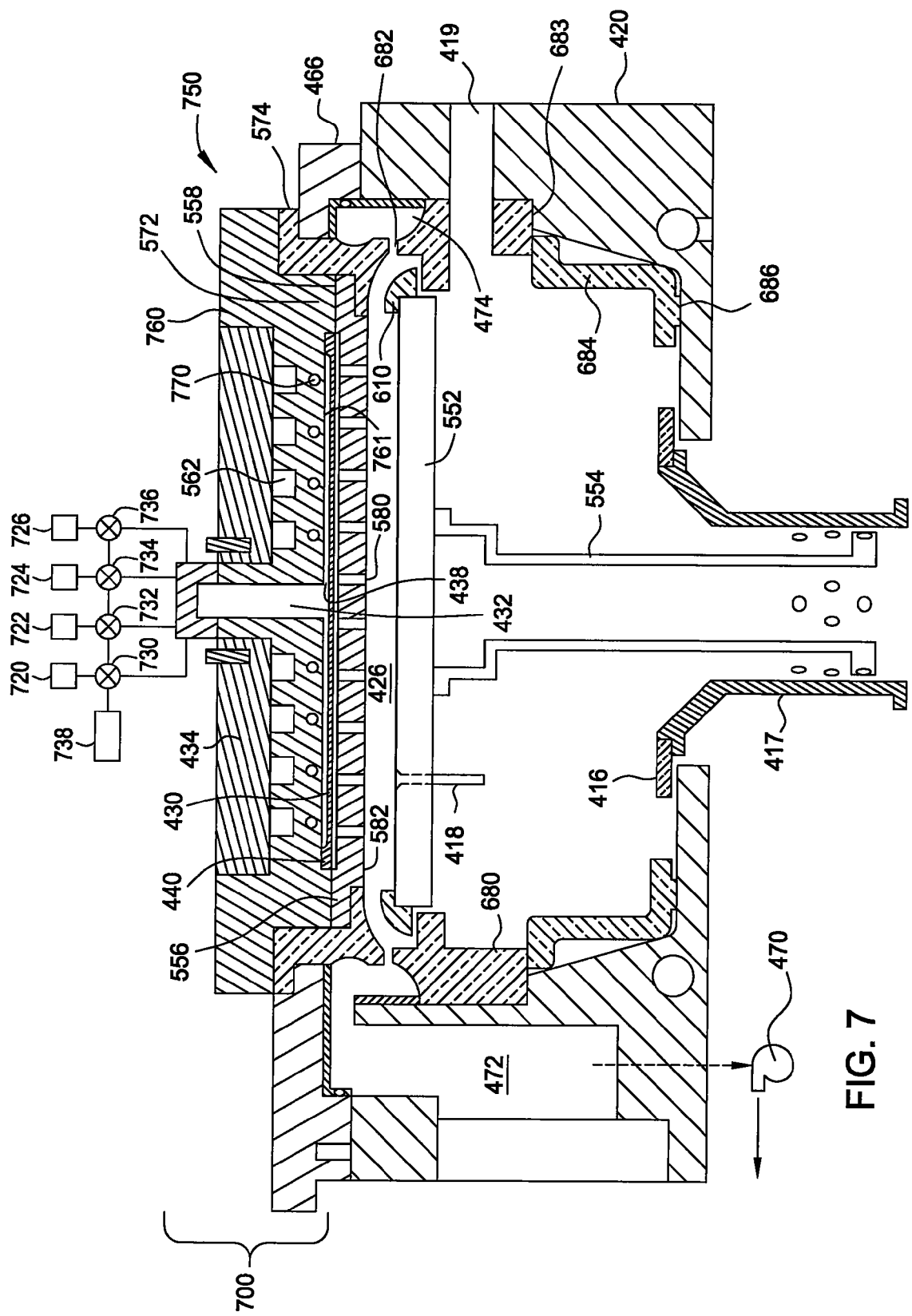
FIGS. 7-9 depict a schematic of another processing chamber according to other embodiments described herein.
Figure 8:
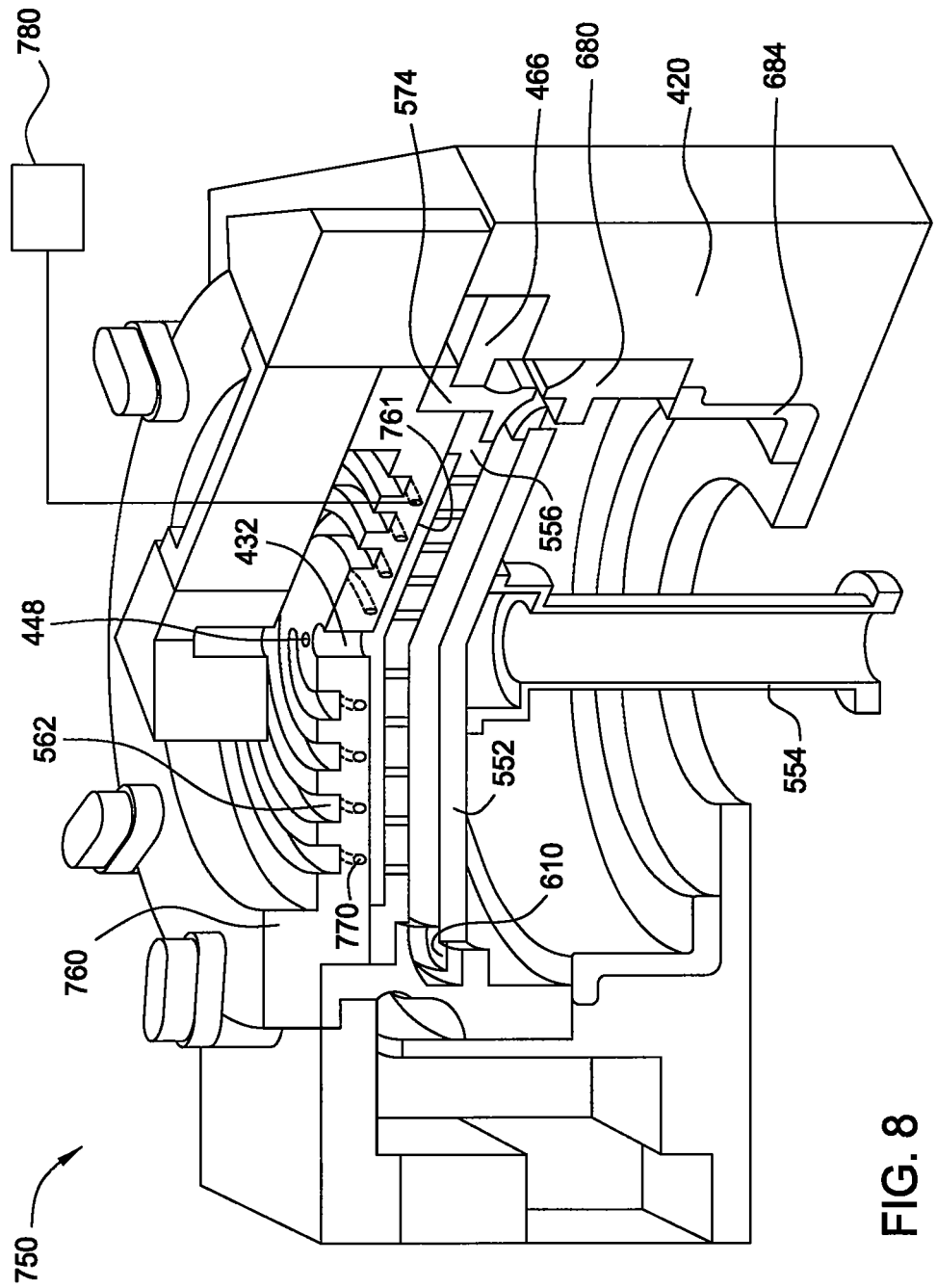
Figure 9:
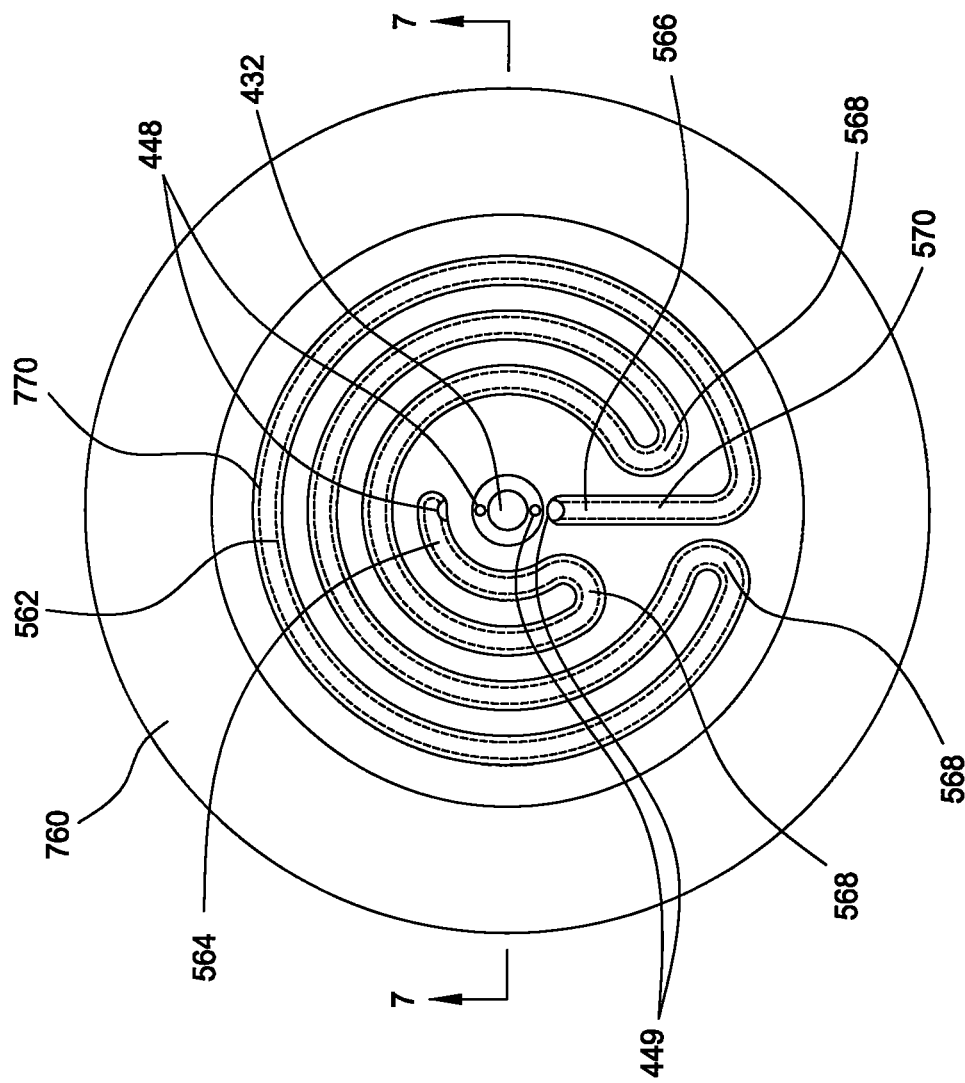

In another embodiment, FIGS. 7-9 illustrate processing chamber 750 containing convolute liquid channel 562 and resistive heating element 770 that may be used to form tungsten-containing materials by vapor deposition process as described herein. Resistive heating element 770 may be a wire and may be formed of or contain a metal such as copper, aluminum, steel, stainless steel, nickel, alloys thereof, or combinations thereof. Resistive heating element 770 may be convolute about gas box plate 760 or may take on a variety of shapes. In one example, resistive heating element 770 contains aluminum and is configured to create a controllable temperature gradient across lower surface 761 of gas box plate 760. Preferably, resistive heating element 770 is configured to create a consistent temperature across lower surface 761 of gas box plate 760.

In other embodiments, processing chamber 750 is connected to and in fluid communication with sources 720, 722, 724, and 726. In one configuration, source 720 is a carrier gas source and contains a carrier gas, source 722 is a tungsten gas source and contains a tungsten precursor, source 724 is a nitrogen source and contains a nitrogen precursor, source 726 is a reducing agent gas source and contains a reducing agent.

Valve 730 may be positioned between source 720 and gas port 432, valve 732 may be positioned between source 722 and gas port 432, valve 734 may be positioned between source 724 and gas port 432, and valve 736 may be positioned between source 726 and gas port 432. Programmable logic controller (PLC) 738 may be used to control the opening and closing of valves 730, 732, 734, and 736 during a CVD process, a pulsed-CVD process, or an ALD process. Valve 730 may be left turned on to provide a steady stream or flow of a carrier gas from source 720.

In one example, source 720 may contain a carrier gas such as nitrogen, argon, hydrogen, forming gas, or mixtures thereof. Source 722 may have a tungsten precursor, such as tungsten hexafluoride and source 724 may have a nitrogen precursor such as ammonia. A reducing agent may be contained within source 726, which is coupled to and in fluid communication with lid assembly 700. The reducing agent may be silane, hydrogen, diborane, disilane, phosphine, derivatives thereof, or combinations thereof.

Valve 732 may be positioned between source 722 containing the tungsten precursor and lid assembly 700, valve 734 positioned between source 724 containing the nitrogen precursor and lid assembly 700, and valve 736 positioned between source 726 and the reducing agent and lid assembly 700. Each of valves 720, 722, 724, and 726 is independently controlled by PLC 738. In one example, PLC 738 is configured to sequentially open and close valves 722 and 726 while forming a tungsten nucleation layer during an ALD process. In another example, PLC 738 is configured to simultaneously open and close valves 722 and 724 while forming a tungsten nitride layer during a CVD process. In another example, PLC 738 is configured to sequentially open and close valves 722 and 744 while forming a tungsten nitride layer during a second ALD process. In another example, PLC 738 is configured to open and close valve 736 during a pre-nucleation soak process or a post-nucleation soak process while the substrate is exposed to a reducing agent delivered from source 726.

The tungsten-containing materials may contain metallic tungsten, tungsten nitride, tungsten silicide, tungsten boride, tungsten phosphide, derivatives thereof, or combinations thereof. Processing chamber 750 may be used to perform CVD, PE-CVD, pulsed-CVD, ALD, PE-ALD, derivatives thereof, or combinations thereof. Controller 780 and resistive heating element 770 may be used to regulate the temperature of lid assembly 700 during the vapor deposition process for depositing a tungsten-containing material. In one embodiment, lid assembly 700 or gas box plate 760 may be heated or maintained at a temperature within a range from about 120° C. to about 180° C., preferably, from about 140° C. to about 460° C., and more preferably, from about 145° C. to about 155° C., such as about 150° C., during the vapor deposition process of a tungsten-containing material. Convolute liquid channel 562 may be used to heat or cool lid assembly 700.

Showerhead 556 has a relatively short upwardly extending rim 558 screwed to gas box plate 760. Both showerhead 556 and gas box plate 760 may be formed of a metal, such as aluminum, stainless steel, or alloys thereof. Convolute liquid channel 562, illustrated in FIG. 9, is formed in the top of gas box plate 760 and covered and sealed by water cooling cover plate 434. Water is generally flown through convolute liquid channel 562. However, alcohols, glycol ethers, and other organic solvents may be used solely or mixed with water to transfer heat away from or to lid assembly 700.

Water ports 448 and 449 through water cooling cover plate 434 are illustrated in FIGS. 8-9. Water ports 448 and 449 connect ends 564 and 566 of liquid channel 562 near to the center of gas box plate 760. Convolute liquid channel 562 is formed in a serpentine though generally circumferential path having bends 568 (e.g., three sharp U-turns or U-shaped bends) as the path progresses from the inside to the outside until the path returns to the inside in radial channel 570. Liquid channel 562 is narrow enough and bends 568 are sharp enough to ensure that the flow of water or other fluids becomes turbulent, thus aiding the flow of heat from the flange of gas box plate 760 to the water in channel 562. A liquid temperature regulating system (not shown) may be attached to water ports 448 and 449 and convolute liquid channel 562 and used to transfer heat away from or to lid assembly 700. In one example, lid assembly 700 is configured to be heated or maintained at a temperature of about 150° C. and is in fluid communication with a source of tungsten precursor (e.g., $WF_6$) and a source of a nitrogen precursor (e.g., $NH_3$).

Several CVD processing chambers that may be useful for some of the deposition processes described herein may be further described in commonly assigned U.S. Pat. Nos. 5,846,332, 6,079,356, 6,162,715, and 6,827,815, which are incorporated herein by reference in their entirety. Several ALD processing chambers that may be useful for some of the deposition processes described herein may be further described in commonly assigned U.S. Pat. Nos. 6,660,126, 6,716,287, 6,821,563, 6,878,206, 6,916,398, 6,936,906, 6,998,014, 7,175,713, and 7,204,886, commonly assigned U.S. Ser. No. 09/798,258, filed Mar. 2, 2001, and published as 2002-0121241; U.S. Ser. No. 10/032,293, filed Dec. 21, 2001, and published as 2003-0116087; U.S. Ser. No. 10/356,251, filed Jan. 31, 2003, and published as 2004-0065255; U.S. Ser. No. 10/268,438, filed Oct. 9, 2002, and published as 2004-0069227; U.S. Ser. No. 11/127,753, filed May 12, 2005, and published as 2005-0271812; U.S. Ser. No. 10/281,079, filed Oct. 25, 2002, and published as 2003-0121608, and commonly assigned U.S. Ser. Nos. 11/556,745, 11/556,752, 11/556,756, 11/556,758, and 11/556,763, each filed on Nov. 6, 2006, and published as 2007-0119370, 2007-0119371, 2007-0128862, 2007-0128863, 2007-0128864, which are incorporated herein by reference in their entirety.

In one embodiment, a processing chamber for depositing tungsten-containing materials contains a lid plate containing an embedded heating element disposed therein. In another embodiment, a processing chamber for depositing tungsten-containing materials contains a gas box plate containing an embedded heating element disposed therein. In another embodiment, a processing chamber for depositing tungsten-containing materials contains an insulating jacket heater containing heating element disposed thereon. Heating elements may be configured to generate more heat near a particular region of lid plate, such as an inner region or an outer region. A controller may be used to regulate the temperature of lid plate by adjusting power levels to the heating element. In various embodiments, the processing chamber for depositing tungsten-containing materials may contain an in situ plasma source or a remote plasma source.

In one embodiment, a tungsten nitride layer and a tungsten nucleation layer are deposited during a vapor deposition process. The lid plate may be heated to a temperature within a range from about 140° C. to about 160° C., preferably, about 150° C. A substrate may be exposed to a pre-soak gas containing silane during a pre-soak process. The pre-soak process may last for a time period within a range about 10 seconds to about 30 seconds, preferably about 20 seconds, while the processing chamber may have an internal pressure within a range from about 50 Torr to about 150 Torr, preferably, about 90 Torr. A tungsten nitride layer is deposited at a process temperature within a range from about 375° C. to about 425° C., preferably, about 400° C. The pre-soak process and the tungsten nitride deposition may be repeated about 25 times to form a tungsten nitride material. Subsequently, a tungsten nucleation layer may be deposited by an ALD process by repeating about 15 cycles of exposing the substrate to the tungsten precursor and a reducing agent (e.g., $SiH_4$ or $B_2H_6$).

In one example, the tungsten nitride is deposited by a CVD process wherein the tungsten precursor (e.g., $WF_6$) is co-flowed with the nitrogen precursor (e.g., $NH_3$). The lid assembly contains a lid plate heated to a temperature within a range from about 120° C. to about 180° C., preferably, from about 140° C. to about 160° C., and more preferably, from about 145° C. to about 155° C., such as about 150° C. The processing chamber may have an internal pressure within a range from about 2 Torr to about 20 Torr, such as about 6 Torr. In another example, the tungsten nitride is deposited by an ALD process wherein the tungsten precursor (e.g., $WF_6$) is sequentially pulsed with the nitrogen precursor (e.g., $NH_3$). The substrate may be exposed to multiple ALD cycles, wherein each ALD cycle exposes the substrate to a pre-soak gas containing a reducing agent (e.g., $SiH_4$ or $B_2H_6$) for about 0.5 seconds, purge gas for about 2 seconds, tungsten precursor for about 1.5 seconds, purge gas for about 2 seconds, nitrogen precursor for about 2.5 seconds, and purge gas for about 2 seconds.

While the foregoing is directed to embodiments of the invention, other and further embodiments of the invention may be devised without departing from the basic scope thereof, and the scope thereof is determined by the claims that follow.

The invention claimed is:

1. A processing chamber for depositing a tungsten-containing material by vapor deposition, comprising:
   a lid assembly attached to a chamber body, the lid assembly comprising:
      a lid plate;
      a showerhead;
      a mixing cavity comprising an angled outer wall and an inner wall, wherein the angled outer wall has a notch formed therein;
   a resistive heating element contained within the lid plate and configured to provide the lid plate at a temperature within a range from about 120° C. to about 180° C.;
   a liquid channel within the lid plate and attached to a temperature regulating system;
   a tungsten precursor source coupled with and in fluid communication with the mixing cavity; and
   a nitrogen precursor source coupled with and in fluid communication with the mixing cavity, wherein at least one of the precursor sources is coupled with and in fluid communication with the mixing cavity through the notch.

2. The processing chamber of claim 1, further comprising a reducing agent precursor source coupled with and in fluid communication with the lid assembly.

3. The processing chamber of claim 2, wherein the reducing agent precursor source comprises a reducing agent selected from the group consisting of silane, hydrogen, diborane, disilane, phosphine, derivatives thereof, and combinations thereof.

4. The processing chamber of claim 3, wherein a first valve is disposed between the tungsten precursor source and the lid assembly, a second valve is disposed between the nitrogen precursor source and the lid assembly, and a third valve is disposed between the reducing agent precursor source and the lid assembly.

5. The processing chamber of claim 1, wherein the temperature is within a range from about 140° C. to about 160° C.

6. The processing chamber of claim 5, wherein the temperature is within a range from about 145° C. to about 155° C.

7. The processing chamber of claim 1, wherein the tungsten precursor source comprises tungsten hexafluoride.

8. The processing chamber of claim 7, wherein the nitrogen precursor source comprises ammonia.

9. A processing chamber for depositing a tungsten-containing material by vapor deposition, comprising:
   a lid assembly attached to a chamber body, the lid assembly comprising:
      a lid plate;
      a showerhead; and
      a mixing cavity with an angled wall, wherein the angled wall has a notch formed annularly therein;
   a resistive heating element contained within the lid plate and configured to provide the lid plate at a temperature within a range from about 140° C. to about 160° C.;
   a liquid channel within the lid plate and attached to a temperature regulating system;
   a tungsten precursor source coupled with and in fluid communication with the mixing cavity through a first connection;
   a nitrogen precursor source coupled with and in fluid communication with the mixing cavity; and
   a reducing agent precursor source coupled with and in fluid communication with the lid assembly, wherein at least one of the precursor sources is coupled with and in fluid communication with the mixing cavity through the notch.

10. The processing chamber of claim 9, wherein a first valve is disposed between the tungsten precursor source and the lid assembly, a second valve is disposed between the nitrogen precursor source and the lid assembly, and a third valve is disposed between the reducing agent precursor source and the lid assembly.

11. The processing chamber of claim 9, wherein the temperature is within a range from about 145° C. to about 155° C.

12. The processing chamber of claim 9, wherein the tungsten precursor source comprises tungsten hexafluoride.

13. The processing chamber of claim 12, wherein the nitrogen precursor source comprises ammonia.

14. The processing chamber of claim 9, wherein the reducing agent precursor source comprises a reducing agent selected from the group consisting of silane, hydrogen, diborane, disilane, phosphine, derivatives thereof, and combinations thereof.

* * * * *